United States Patent
Koizumi et al.

(10) Patent No.: US 6,872,634 B2
(45) Date of Patent: Mar. 29, 2005

(54) METHOD OF MANUFACTURING MICRO-SEMICONDUCTOR ELEMENT

(75) Inventors: Naoyuki Koizumi, Nagano (JP); Naohiro Mashino, Nagano (JP); Takashi Kurihara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 27 days.

(21) Appl. No.: 10/453,645

(22) Filed: Jun. 4, 2003

(65) Prior Publication Data

US 2003/0228719 A1 Dec. 11, 2003

(30) Foreign Application Priority Data

Jun. 11, 2002 (JP) ........................................ 2002-169466

(51) Int. Cl.[7] .......................... H01I 21/46; H01I 21/44
(52) U.S. Cl. ...................................... 438/460; 438/106
(58) Field of Search ................................. 438/460, 464, 438/465, 106, 107, 110

(56) References Cited

U.S. PATENT DOCUMENTS

| | | | |
|---|---|---|---|
| 5,480,842 A | 1/1996 | Clifton et al. | 438/464 |
| 5,641,714 A | 6/1997 | Yamanaka | |
| 5,888,883 A | 3/1999 | Sasaki et al. | 438/460 |
| 6,391,679 B1 | 5/2002 | Anker et al. | |
| 6,399,464 B1 | 6/2002 | Muntifering et al. | 438/465 |
| 6,551,438 B1 | 4/2003 | Tanemura | 156/265 |
| 6,589,855 B2 | 7/2003 | Miyamoto et al. | 438/464 |
| 6,642,127 B2 | 11/2003 | Kumar et al. | 438/460 |
| 2001/0049160 A1 | 12/2001 | Watanabe et al. | |

FOREIGN PATENT DOCUMENTS

| JP | 09008095 A | * 1/1997 | H01L/21/68 |
|---|---|---|---|
| JP | 10010017 A | * 1/1998 | G01N/1/02 |

* cited by examiner

*Primary Examiner*—Hoai Pham
*Assistant Examiner*—Hoa B. Trinh
(74) *Attorney, Agent, or Firm*—Staas & Halsey LLP

(57) ABSTRACT

A method of manufacturing a micro-semiconductor element comprising the following steps of: adhering a semiconductor wafer 10 having a circuit surface and a back surface to a support plate 20 via a protective film 22 so that the circuit surface faces to the protective film; reducing a thickness of the semiconductor wafer while the semiconductor wafer is supported by the support plate; dividing the semiconductor wafer into individual semiconductor elements 10*a* while the semiconductor wafer is adhered to the protective film; moving the semiconductor elements from the protective film to an adhesive peeling film 26 in such a manner that the back surfaces of the semiconductor elements are adhered to the peeling film; supporting a periphery of the peeling film by a support ring 28; and picking up the individual semiconductor element by a pickup device when the back surface of semiconductor element is pushed up, via the peeling film, by a pushup pin 30. An individual semiconductor element can also be picked up by an air suction nozzle 36.

4 Claims, 4 Drawing Sheets

METHOD OF MANUFACTURING MICRO-SEMICONDUCTOR ELEMENT

BACKGROUND OF THE INVENTION

1. Field of the Invention

The present invention relates to a method of manufacturing a micro-semiconductor element of the following very small dimensions: the thickness is not more than hundreds of $\mu$m; and the length of one side is not more than 1 mm.

2. Description of the Related Art

Due to the reduction in the size of electronic equipment, the size of a semiconductor element mounted on the electronic equipment has been remarkably reduced and, further, the density of the same has remarkably been increased. Due to the foregoing, the semiconductor element is now used for various objects. For example, a micro-semiconductor element is mounted on IC card and used for recording and reproducing various data. Recently, a micro-semiconductor element has been developed, the thickness of which is about 100 $\mu$m, the size of which about 0.5 mm square, so that the micro-semiconductor element can be embedded in a sheet of paper. When this micro-semiconductor element is embedded in an article so as to be used as a wireless tag, it becomes possible to discriminate and authenticate goods. Therefore, the micro-semiconductor element can be used for various new purposes.

However, a micro-semiconductor element, the thickness of which is about 100 $\mu$m and the size of which is 0.5 mm square, is difficult to handle and convey. Further, it is difficult for on micro-semiconductor element to be picked up, individually, and mounted on electronic equipment.

FIGS. 5(a) to 5(d) are views showing a conventional method in which a wafer is diced so as to be divided into individual pieces, and the individual semiconductor elements thus divided are mounted on electronic parts. FIG. 5(a) is a view showing a state in which the semiconductor wafer 10 is made to adhere to a protective tape 12 so that a circuit face of the semiconductor wafer 10 is directed to the adhesive face side of the protective tape 12, and FIG. 5(b) is a view showing a state in which the back face of the semiconductor wafer 10 is polished so as to reduce the thickness thereof to a predetermined thickness. Next, as shown in FIG. 5(c), the protective tape 12 is peeled off from the semiconductor wafer 10, the thickness of which has been formed into the predetermined thickness. Then, as shown in FIG. 5(d), the semiconductor wafer 10 is made to adhere to a support tape 15, which is supported by the dicing ring 14, so that the circuit face of the semiconductor wafer 10 is set on the upper side. After the semiconductor wafer is diced to individual pieces, the individual pieces of the semiconductor wafer are picked up from the support tape 15 and mounted on electronic parts.

In the case of a commonly used semiconductor element, the thickness thereof is approximately 1 mm, and the size is approximately several mm square. Therefore, the semiconductor element can be easily picked up by a pickup device having a suction pad. However, in the case of a micro-semiconductor element, the thickness of which is not more than 100 $\mu$m or the size of which is not more than 1 mm square, it is difficult to appropriately pick up the micro-semiconductor element by a conventional pickup method as mentioned above. Further, the pickup operation can not be effectively executed.

SUMMARY OF THE INVENTION

The present invention has been accomplished to solve the above problems of the prior art.

It is an object of the present invention to provide a method of manufacturing a micro-semiconductor element characterized in that the semiconductor element can be made very thin and small in size.

It is another object of the present invention to provide a method of manufacturing a micro-semiconductor element characterized in that a pickup operation of the semiconductor element and a mounting operation of mounting the semiconductor element can be easily and effectively executed.

According to the present invention, there is provided a method of manufacturing a micro-semiconductor element comprising the following steps of: adhering a semiconductor wafer having a circuit surface and a back surface to a support plate via a protective film so that the circuit surface faces the protective film; reducing a thickness of the semiconductor wafer while the semiconductor wafer is being supported by the support plate; dividing the semiconductor wafer into individual semiconductor elements while the semiconductor wafer is being adhered to the protective film; replacing the semiconductor elements from the protective film to an adhesive peeling film in such a manner that the back surfaces of the semiconductor elements are adhered to the peeling film; supporting a periphery of the peeling film by a support ring; and picking up the individual semiconductor element by a pickup device when the back surface of semiconductor element is pushed up via the peeling film by a pushup pin.

It is preferable that the protective film is subjected to a treatment by which the adhesion property thereof is lost or reduced before the semiconductor elements are moved from the protective film to the peeling film; and also the peeling film is subjected to the same treatment by which the adhesion property thereof is lost or reduced before the semiconductor elements are picked up by the pickup device.

It is preferable that the treatment, by which the adhesion properties of the protective film and the peeling film, is conducted by heating these films or irradiating ultra-violet ray on to these films.

According to another aspect of the present invention there is provided a manufacturing method of a micro-semiconductor element comprising the following steps of: adhering a semiconductor wafer having a circuit surface and a back surface to a support plate via a protective film so that the circuit surface faces the protective film; reducing a thickness of the semiconductor wafer while the semiconductor wafer is supported by the support plate; dividing the semiconductor wafer into individual semiconductor elements while the semiconductor wafer is being adhered to the protective film; moving the semiconductor elements from the protective film to an adhesive peeling film in such a manner that the back surfaces of the semiconductor elements are being adhered to the peeling film; subjecting the peeling film to a treatment by which the adhesion property thereof is lost or reduced; and accommodating the semiconductor elements in an accommodating container by air-sucking the individual semiconductor elements from the peeling film by an air suction nozzle.

In this case, it is preferable that the protective film is also subjected to a treatment by which the adhesion property thereof is lost or reduced before the semiconductor elements are moved from the protective film to the peeling film.

Also it is preferable that a roller comes into contact with a second surface of the peeling film opposite to a first surface thereof to which the semiconductor elements are adhered so as to move the peeling film to be bent or pulled when the individual semiconductor elements are air-sucked from the peeling film.

According to still another aspect of the present invention, there is provided a manufacturing method of a micro-semiconductor element comprising the following steps of: adhering a semiconductor wafer having a circuit surface and a back surface to a support plate via a protective film so that the circuit surface faces the protective film; reducing a thickness of the semiconductor wafer while the semiconductor wafer is supported by the support plate; dividing the semiconductor wafer into individual semiconductor elements while the semiconductor wafer is adhered to the protective film; subjecting the protective film to a treatment by which the adhesion property thereof is lost or reduced; and accommodating the semiconductor elements into an accommodating container by air-sucking the individual semiconductor elements from the peeling film by an air suction nozzle.

DETAILED DESCRIPTION OF THE PREFERRED EMBODIMENTS

Referring to the accompanying drawings, a preferred embodiment of the present invention will be explained in detail as follows.

FIGS. 1(a) to 1(f) are schematic illustrations showing a manufacturing method of a micro-semiconductor element of the present invention.

Figure 1A:
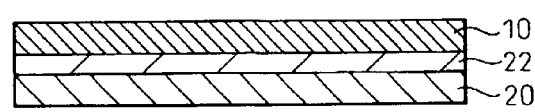
FIGS. 1(a) to 1(f) are schematic illustrations showing a manufacturing method of a micro-semiconductor element of the present invention.

FIG. 1(a) is a view showing a state in which the semiconductor wafer 10, which is a workpiece, is supported by the support plate 20 via the protective film 22 by means of adhesion. Before having been polished, the semiconductor wafer has a thickness of 725 $\mu$m (8 inch type) or 625 $\mu$m (6 inch type). The support plate 20 is used for the purpose of positively holding the semiconductor wafer 10 when the semiconductor wafer 10 is polished to reduce the thickness thereof to about 100 $\mu$m. In this embodiment, the semiconductor wafer 10 is made to adhere to the support plate 20 by a double coated adhesion type protective film 22.

An appropriate material, such as a silicon wafer or glass pane, can be used as the support plate 20 as long as the profile of the support plate can be maintained to a certain extent.

When the support plate 20 is composed of a silicon wafer, it is possible to provide such advantages that the flatness is good and no thermal stress is generated because the material of the support plate 20 is the same as that of the semiconductor wafer 10.

When the support plate 20 is composed of a glass pane, it is possible to provide an advantage in the case where the protective film 22 is made of an ultraviolet-ray setting resin and the adhesion property of the protective film 22 can be lost by irradiating ultraviolet-rays through the support plate 20. In order to transmit ultraviolet-rays through the support plate 20, it is effective that the support plate 20 is made of quartz glass.

Figure 1B:
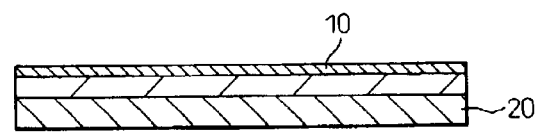

FIG. 1(b) is a view showing a case in which the semiconductor wafer 10 is supported by the support plate 20 and polished so that the thickness can be decreased to about 100 $\mu$m. As the back face, which is the opposite side to the circuit face side, of the semiconductor wafer 10 is be polished, the circuit face side of the semiconductor wafer 10 is made to adhere to the adhesive face of the protective film 22.

In this connection, the method of reducing the thickness of the semiconductor wafer 10 to a predetermined value is not limited to the means for polishing but it is possible to use means for grinding and/or dry-etching and/or wet-etching.

Figure 1C:
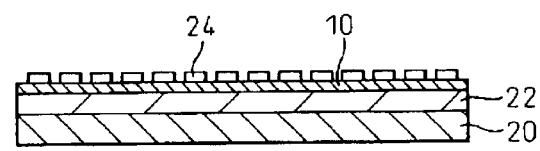
Figure 1D:
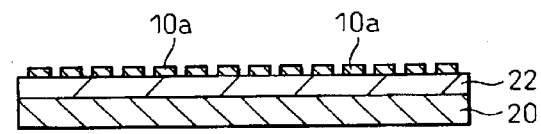

FIGS. 1(c) and 1(d) are views showing a process in which the semiconductor wafer 10 supported by the support plate 20 is divided into individual pieces. It is of course possible to divide the semiconductor wafer 10 into the individual pieces by means of blade dicing, however, the present embodiment employs a method in which the semiconductor wafer 10 is divided into the individual pieces by means of plasma-etching.

FIG. 1(c) is a view showing a state in which photosensitive resist is coated on an exposing surface of the semiconductor wafer 10, and the exposing surface is exposed to light and developed, so that the resist pattern 24 is formed in which only the portions to be left as the individual semiconductor elements are coated with resist.

When plasma etching is conducted under the condition that the resist pattern 24 is formed, the exposed portions of the semiconductor wafer 10 are etched. Therefore, the semiconductor wafer 10 can be divided into the individual pieces along the visible outline of each semiconductor element.

FIG. 1(d) is a view showing a state in which, after the semiconductor wafer 10 has been subjected to plasma-etching so that the semiconductor wafer 10 is divided into individual pieces, the resist pattern 24 is removed and the thus formed individual pieces of the semiconductor elements 10 are still adhered to the protective film 22 and supported by the support plate 20.

Figure 1E:
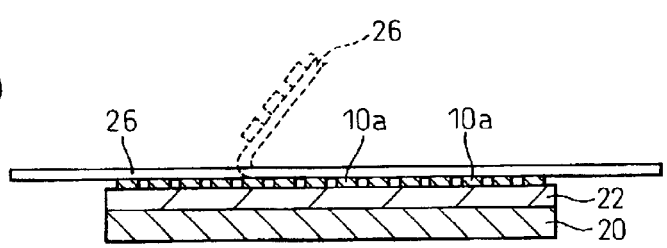

According to the manufacturing method of the micro-semiconductor element of this embodiment, as shown in FIG. 1(e), the semiconductor elements 10a adhered to the protective film 22 are transferred to the peeling film 26.

In order to transfer the semiconductor elements 10a to the peeling film 26, an adhesive film is used as the peeling film 26, and the peeling film 26 is made to adhere to the back face side of the semiconductor elements 10a (the opposite side to the face on which the semiconductor elements 10a adhere to the protective film 22). Under the above condition, the semiconductor elements 10a are removed from the protective film 22 to the peeling film 26 in such a manner that the semiconductor elements 10a are peeled off from the protective film 22.

In order to peel the semiconductor elements 10a from the protective film 22 and remove the semiconductor elements to the peeling film 26, it is preferable that the adhesion force of the protective film 22 adhering to the semiconductor elements 10a is previously lost. In the case where the protective film 22 has a thermal peeling property in which the adhesive force is lost by heating, the protective film may be previously heated so as to lose the adhesive force. In the case where the adhesive force of the protective film 22 is lost by irradiating ultraviolet-rays, the protective film 22 is previously irradiated with ultraviolet-rays so as to lose the adhesive force.

As shown in FIG. 1(e), the peeling film 26 is adhered to the back face side of the semiconductor elements 10a, and the peeling film 26 is gradually peeled off from one end side of the support plate 20. Then, the semiconductor elements 10a are peeled off from the protective film 22 and removed to the peeling film 26 by being made to adhere to the peeling film 26.

Figure 1F:
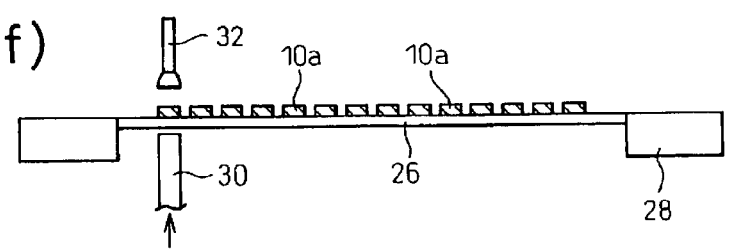

FIG. 1(f) is a view showing operation of picking up the semiconductor elements 10a which is supported by the peeling film 26 in such a manner it is adhered to the peeling film 26. The peeling film 26 onto which the semiconductor elements 10a are made to adhere is supported by the support ring 28 at the peripheral portion and is subjected to a pickup operation.

When the peripheral portion of the peeling film 26 is supported by the support ring 28, a large number of semiconductor elements 10a are supported by the support ring 28 and the peeling film 26. Therefore, it is possible to positively support the semiconductor elements 10a which are difficult to handle. By conducting the pickup operation when the semiconductor elements 10a are mounted on electronic parts, it becomes easy to accommodate the semiconductor elements 10a on the peeling film 26 while the semiconductor elements 10a are adhered to the peeling film 26.

The present embodiment is characterized as follows. When the semiconductor elements 10a are picked up from the peeling film 26, each semiconductor element 10a is pushed up together with the peeling film 26 by a pushup pin 30, and the semiconductor element 10a, which has been thus pushed up, is picked up by the pickup 32 having an air-suction pad.

In this connection, in the case where the semiconductor elements 10a are picked up from the peeling film 26, an operation was previously conducted on the peeling film 26 so that the adhesion property of the peeling film 26 was lost. In the same manner as that of the protective film 22, the peeling film 26 is composed of a film, the adhesive force of which can be lost by heating the peeling film 26 or by irradiating ultraviolet-rays to the peeling film 26, and when the semiconductor elements 10a are replaced from the protective film 22, the peeling film 26 is provided with the adhesion property, and when the semiconductor elements 10a are picked up, treatment is conducted on the peeling film 26 so that the adhesive force of the peeling film 26 can be lost, and then the semiconductor elements 10a are picked up.

When the semiconductor element 10 is pushed up together with the peeling film 26 by the pushup pin 30, the objective semiconductor element 10a to be picked up is pushed up to a position higher than the other semiconductor elements 10a. Therefore, the objective semiconductor element 10a to be picked up can be picked up without interfering with the other semiconductor elements 10a.

In this embodiment, when the semiconductor elements 10a are moved from the protective film 22 to the peeling film 26, the semiconductor elements 10a can be supported by the peeling film 26 so that the circuit face of each semiconductor element 10a can be set on the pickup side (exposure face side). Therefore, it becomes possible to mount the semiconductor elements 10a on electronic parts while the circuit faces are set on the exposure face side.

It is not necessarily effective to pick up the semiconductor element 10a from the peeling film 26 one by one with the pickup 32. However, the method of picking up the semiconductor element 10a from the peeling film 26 one by one with the pickup 32 is advantageous in that each semiconductor element 10a can be positively supported and picked up so that the semiconductor element 10a can be picked up without being damaged and, further, the semiconductor element 10a can be positively positioned at a predetermined position.

When the semiconductor element 10a is picked up from the peeling film 26 in the embodiment described above, the following problems may be encountered. In the case of a micro-semiconductor element 10a, the size of which is not more than 0.5 mm square, when the semiconductor element 10a is pushed up by the pushup pin 30 as shown in FIG. 1(f) by the pickup device in which a conventional suction pad is used, it would be difficult to appropriately pick up the semiconductor elements 10a one by one. Further, this micro-semiconductor element 10a is very light and can easily stick anywhere due to static electricity. Therefore, it is very difficult to handle the micro-semiconductor element.

Figure 2:
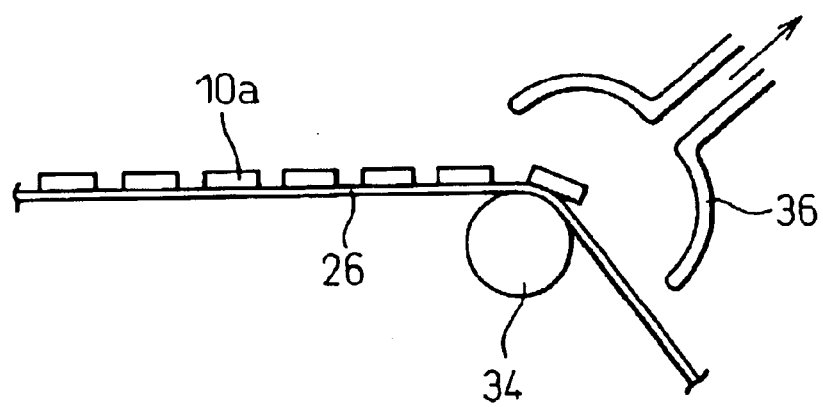
FIG. 2 is a schematic illustration showing a method of sucking semiconductor elements by air.
Figure 3:
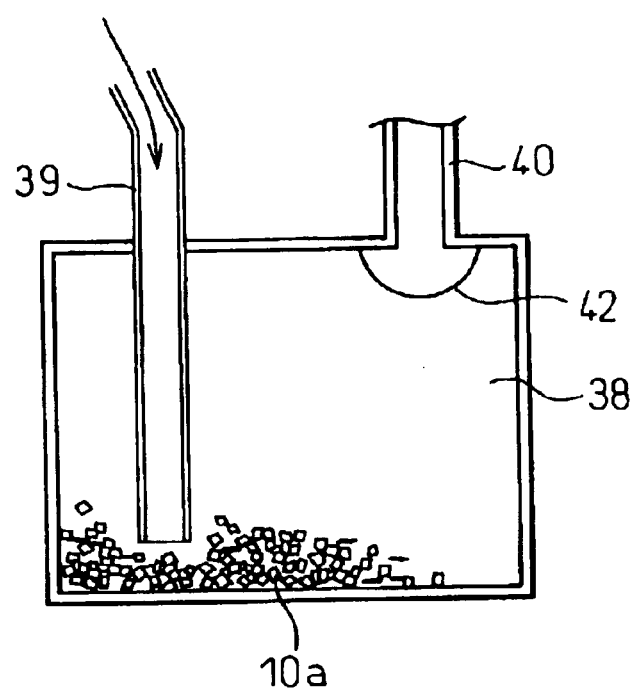
FIG. 3 is a schematic illustration showing a state in which semiconductor elements are accommodated in an accommodating container.

FIGS. 2 and 3 are views showing a method of picking up the micro-semiconductor elements 10a which are accommodated into a container when the semiconductor elements 10a are sucked by air.

In this embodiment, as shown in FIG. 1(e), the semiconductor elements 10a are moved from the protective film 22 to the peeling film 26, and the peeling film 26 is heated or irradiated with ultraviolet-rays so that an adhesive force of the peeling film 26 can be lost and then, as shown in FIG. 2, a lower face of the peeling film 26 is made to come into contact with the roller 34, and the peeling film 26 is moved while the peeling film 26 is being bent and pulled. At this moment, the semiconductor elements 10a are sucked by the suction nozzle 36.

The suction nozzle 36 is connected to the inlet 39 of the accommodating container 38 shown in FIG. 3. When the air in the accommodating container 38 is removed by the suction duct 40, the semiconductor elements 10a are sucked and accommodated in the accommodating container 38.

When the peeling film 26 is moved by the roller 34 along its periphery, the semiconductor elements 10a are peeled off from the peeling film 26 when they pass the roller 34. Therefore, the semiconductor elements 10a can be easily sucked by the suction nozzle 36. The semiconductor elements 10a are so light that the semiconductor elements 10a peeled off from the peeling film 26 can be easily moved into the accommodating container 38 by the air flow.

In the accommodating container 38, an opening portion of the suction duct 40 is shielded by the shielding net 42. Therefore, the semiconductor elements 10a are not sucked onto the vacuum suction side of the vacuum duct 40.

The above method of accommodating the semiconductor elements 10a from the peeling film 26 into the accommodating container 38 by the flow of air is advantageous in that the operation of picking up the semiconductor elements 10a from the peeling film 26 is very simple.

However, in the method of collecting the semiconductor elements 10a into the accommodating container 38 by the suction of air, the semiconductor elements 10a are accommodated into the accommodating container 38 in random directions and, further, some semiconductor elements 10a are accommodated into the accommodating container 38 while the front faces of the semiconductor elements are set upward, and the other semiconductor elements 10a are accommodated into the accommodating container 38 while the back faces of the semiconductor elements are set upward. Accordingly, this pickup method is suitably used when the semiconductor elements 10a are used irrespective of the directions of the semiconductor elements 10a.

In this connection, the semiconductor elements 10a are minute and light. Accordingly, even when the semiconductor elements 10a come into contact with each other in the process of air suction, there is no possibility of damage to the semiconductor elements 10a.

Figure 4A:
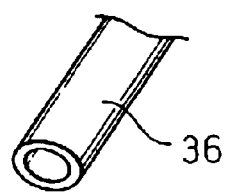
FIGS. 4(a) to 4(c) are schematic illustrations showing some forms of a suction nozzle.
Figure 4B:
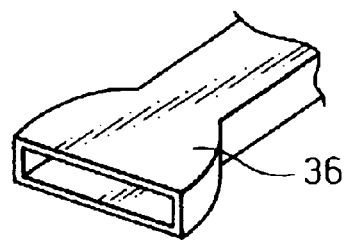
Figure 4C:
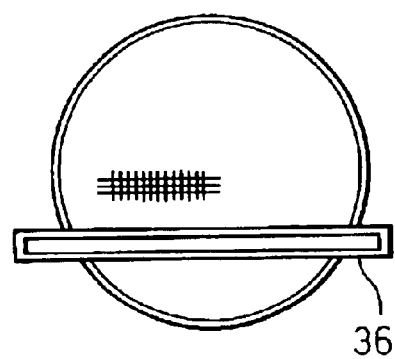
Figure 5A:
FIGS. 5(a) to 5(d) are schematic illustrations showing a method of picking up individual pieces of semiconductor elements known in the prior art.
Figure 5B:
Figure 5C:
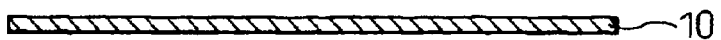
Figure 5D:
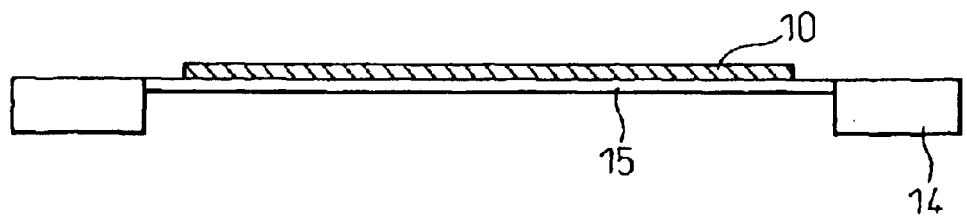

FIGS. 4(a)–4(c) are views showing several examples of the suction nozzle for sucking the semiconductor elements 10a. FIG. 4(a) is a view showing a simple circular pipe-shaped suction nozzle, FIG. 4(b) is a view showing a suction nozzle, the suction port of which is formed wide, and FIG. 4(c) is a view showing a suction nozzle, the opening portion of the suction nozzle 36 of which extends to the overall width of the peeling film 26 so that a number of semiconductor elements 10a arranged as the wafer can be sucked simultaneously with respect to the overall width of the peeling film 26.

In any case, the material of the suction nozzle 36 is not particularly limited to a specific material. However, it is preferable to use a material that does not affect the characteristic of the semiconductor element 10a. Further, it is preferable to use a material, such as a conductive plastic, that is seldom affected by static electricity.

In the case where the semiconductor elements 10a are accommodated in the accommodating container 38 by the flow of air as shown in this embodiment, there is no problem as to which direction the circuit surface of each semiconductor element 10a is directed to. Therefore, the semiconductor elements 10a are not necessarily moved from the protective film 22 to the peeling film 26 as in the case shown in FIG. 1(e). In the case where the semiconductor elements 10a can be easily peeled off from the protective film 22 in the state shown in FIG. 1(d), the semiconductor elements 10a can be peeled off from the protective film 22 and accommodated in the accommodating container 38 when the semiconductor elements 10a are sucked by the suction nozzle 36.

In the above embodiment, the manufacturing method of a micro-semiconductor element is explained. However, it should be noted that the present invention can be applied to a method of manufacturing a semiconductor element of normal size.

According to the manufacturing method of a micro-semiconductor element of the present invention, as described above, even if it is a very small semiconductor element having the following dimensions: not more than 100 μm thick and not more than 1 mm square, the semiconductor element can be easily formed by means of polishing. Further, it is easy to pick up semiconductor elements, which have been formed into individual pieces, and to mount the semiconductor elements on electronic parts. When the method of sucking semiconductor elements by air is adopted, it is possible to effectively pick up the micro-semiconductor elements and accommodate them in an accommodating container.

What is claimed is:

1. A method of manufacturing a micro-semiconductor element, comprising:

adhering a semiconductor wafer, having a circuit surface and a back surface, to a support plate via a protective film so that the circuit surface faces the protective film;

reducing a thickness of the semiconductor wafer while the semiconductor wafer is supported by the support plate;

dividing the semiconductor wafer into individual semiconductor elements while the semiconductor wafer is adhered to the protective film;

moving the semiconductor elements from the protective film to a first surface of an adhesive peeling film in such a manner that the respective back surfaces of the individual semiconductor elements are adhered to the first surface of the peeling film;

subjecting the peeling film to a treatment by which the adhesion property thereof is lost or reduced; and accommodating the semiconductor elements in an accommodating container by sucking the individual semiconductor elements from the peeling film using an air suction nozzle.

2. A manufacturing method, as set forth in claim 1, wherein the protective film is also subjected to a treatment by which the adhesion property thereof is lost or reduced before the semiconductor elements are moved from the protective film to the peeling film.

3. A manufacturing method, as set forth in claim 1, wherein a roller comes into contact with a second surface of the peeling film opposite to a the the first surface thereof to which the semiconductor elements are adhered, so as to bend the peeling film so that the individual semiconductor air-sucked from the peeling film.

4. A method of manufacturing a micro-semiconductor element, comprising:

adhering a semiconductor wafer, having a circuit surface and a back surface, to a support plate via a protective film so that the circuit surface faces the protective film;

reducing a thickness of the semiconductor wafer while the semiconductor wafer is supported by the support plate;

dividing the semiconductor wafer into individual semiconductor elements while the semiconductor wafer is adhered to the protective film;

subjecting the protective film to a treatment by which the adhesion property thereof is lost or reduced; and accommodating the semiconductor elements in an accommodating container by sucking the individual semiconductor elements from the peeling film by an air suction nozzle.

* * * * *

UNITED STATES PATENT AND TRADEMARK OFFICE
CERTIFICATE OF CORRECTION

PATENT NO. : 6,872,634 B2
DATED : March 29, 2005
INVENTOR(S) : Naoyuki Koizumi et al.

It is certified that error appears in the above-identified patent and that said Letters Patent is hereby corrected as shown below:

Column 8,
Line 30, change "a the the" to -- the --.
Line 32, after "semiconductor" insert -- elements are more easily --.
Line 40, change "water" to -- wafer --.

Signed and Sealed this

Twenty-seventh Day of December, 2005

JON W. DUDAS
*Director of the United States Patent and Trademark Office*